PRESSURE-RESPONSIVE SEMICONDUCTOR DEVICE

United States Patent Office 3,426,424
Patented Feb. 11, 1969

3,426,424
PRESSURE-RESPONSIVE SEMICONDUCTOR DEVICE

Wolfgang Touchy, Munich, Germany, assignor to Siemens Aktiengesellschaft, a corporation of Germany Original application Sept. 11, 1964, Ser. No. 395,792, now Patent No. 3,292,057, dated Dec. 13, 1966. Divided and this application Aug. 2, 1966, Ser. No. 586,342
Claims priority, application Germany, Sept. 13, 1963, S 87,344
U.S. Cl. 29—578 2 Claims
Int. Cl. B01j *17/34;* H01l *7/32, 7/02*

ABSTRACT OF THE DISCLOSURE

A method of producing a pressure sensitive semiconductor device having three regions with two P–N junctions between them, one of the regions being engaged by a pressure member under variable contact pressure, in which a junction between two regions is shifted by heat before the third region, to which the pressure is applied, is formed in one of the two regions by a diffusion operation.

The present application is a division of United States patent application Ser. No. 395,792, filed Sept. 11, 1964 and issued as United States Patent No. 3,292,057 on Dec. 13, 1966.

The present invention relates to a pressure-responsive semiconductor device. More particularly, the invention relates to a pressure-responsive semiconductor device having three sequential regions of different conductance types forming between them two p-n junctions, one of the regions being engaged or abutted by a pressure member under variable contact pressure.

It is known to utilize the pressure sensitivity of transistors in microphones, oscillation transducers, acceleration gages, sound pickups, hearing aids, barometers, backpressure gages, and similar devices. In a known type of transistor, a pressure point of sapphire is connected to an acoustic diaphragm and exerts a variable pressure upon the emitter region of a transistor having a diffused base. The pressure variation occurring when the diaphragm is excited causes a change in the magnitude of the collector current. The efficiency of such a system is up to one hundred times greater than the efficiency of a carbon microphone.

A pressure-sensitive semiconductor device, as essentially illustrated in FIG. 1, has already been suggested. The embodiment of FIG. 1 is a transistor produced by the planar technique. The transistor comprises a collector region 1, a base region 2 and an emitter region 3 which border each other via p-n junctions. Thus, the collector region 1 and the base region 2 form between them a collector-base junction 4 and the emitter region 3 and the base region 2 form between them an emitter-base junction 5.

An oxide layer 7 serves as a masking for the regions 2 and 3 which are formed by diffusion. The oxide layer 7 also constitutes a protective coating for the surface of the finished semiconductor device and particularly for the surface areas where the p-n junction emerges at the surface. The emitter region 3 is provided with an electrode 10 and the base region 2 is provided with an electrode 8. The collector region 1 is contacted by an electrode 6.

In this type of device, when variable pressure is applied to the emitter region 3 by a pressure point 9, the collector current decreases with increased pressure upon said emitter region. Thus, in such a device, control of the current flowing through the transistor is possible only up to a magnitude of pressure at which the current becomes zero. The range of control is thus limited in this device.

If pressure is applied to the base region, however, the collector current increases with increasing pressure and the range of control is considerably extended over that of the device of FIG. 1 in which pressure is applied to the emitter region. However, the pressure sensitivity of the device is great only if the pressure is applied directly to the surface of the semiconductor body in the area where the collector-base p-n junction emerges at said surface. If the pressure is applied to the base region, the pressure sensitivity is very small, due to the great distance between the collector-base p-n junction 4 and the surface areas at which the pressure is applied. Furthermore, in the device of FIG. 1, the oxide layer between the pressure point and the base region impedes the transmittal of pressure and hence must be removed. If such portion of the oxide layer is not removed, a great magnitude of biasing pressure must be applied and the pressure variations must be superimposed upon such biasing pressure in order to insure adequate sensitivity of the device to pressure changes.

The pressure-sensitive semiconductor device of the present invention eliminates the disadvantages of the prior art device and comprises a first relatively low-ohmic region which functions as the emitter, a second very thin region adjacent the first region and of opposite conductance type and high-ohmic relative to the first region, and a third region adjacent the second region and of the same conductance type as the first region and very thin. The third region lies adjacent the surface of the semiconductor body and functions as the collector region. The collector region is biased in blocking direction. The pressure point is seated on or abuts the collector region.

In a pressure-sensitive semiconductor device, therefore, the concentration conditions relative to the doping of the individual regions are just the opposite of those in the three layer sequence of conventional transistors. That is, a low-ohmic, relatively thick region forming the emitter is topped by a thin high-ohmic region of the opposite conductance type functioning as the base, and the base is topped by a collector region of the same conductance type as the emitter region.

The collector-base p-n junction is poled in blocking direction and is adjacent to the surface of the semiconductor body. Thus, when a variable pressure is applied to the vicinity of the collector-base p-n junction, at the surface of the semiconductor body of the device of the present invention, the device is highly pressure sensitive.

In the device of the present invention the pressure point abuts against the collector region. When pressure is applied to the pressure point, so that said pressure point presses against the collector region, there is an increase in the magnitude of the blocking or reverse current and this raises the potential within the high-ohmic second region. This causes an emission of charge carriers from the first low-ohmic emitter region into the second high-ohmic base region.

An advantage of the device of the present invention is that only the first and the third regions are provided with electric leads. Therefore, electrical control of the high-ohmic intermediate base region from the outside, as is customary in transistors, is not required in the device of the present invention. The device of the present invention thus has a very simple layer or region arrangement and need for the difficult contacting of the very thin base region is eliminated.

A device in which the intermediate base region is contacted affords increased ganging possibilities due to the additional control of the collector current, but considering the substantially more difficult production of the base region contacts, this additional control may be relinquished.

In accordance with another embodiment of the device of the present invention, the cross section of the second and third regions is smaller than that of the first region. It is advisable to produce the semiconductor device by diffusion according to planar technique, or the device should be produced similarly to the mesa transistor in which the individual regions, particularly the second region, is epitaxially produced.

According to one embodiment of the invention, the pressure member comes to a point having a cross section which is preferably smaller than 20 microns. In order to increase the pressure sensitivity, it is advantageous to seat or abut a plurality of pressure points on the collector region of the surface of the semiconductor body. The plurality of pressure points may be supported or embedded in an elastic medium such as, for example, silicon rubber. Naturally, care must be taken that the pressure points protrude from the embedding medium.

In the pressure-sensitive device of the present invention, in which pressure is applied to the collector region, pressure sensitivity increases with the size of the pressure area. This is of advantage because as the cross section of the pressure point is increased, the blocking current is increased and there is better control of the base.

The pressure point should therefore preferably be blunt or of large cross-sectional area. The pressure point may, for example, have a cross-sectional area larger than 20 microns as long as said cross-sectional area is smaller than the surface area of the collector region. The pressure point may be made of steel or other suitable metal, due to the increased sensitivity of the device and to the low pressure exerted by the pressure point.

When a pressure point having a large cross-sectional area is utilized, it is preferable to provide a surface powder on the surface of the semiconductor body where the pressure point abuts. The surface powder comprises a pointed grain material in pulverized form. The surface powder may be embedded in a plastic layer such as, for example, synthetic plastic or rubber. This aids in providing a wide distribution of the pressure.

A suitable material for the surface powder may comprise, for example, boron carbide. Boron carbide is also suitable for the pressure point when the pressure point has a small cross-sectional area. Instead of the surface powder, small surface balls of the same diameter may be utilized. When it is desired to provide a wide distribution of pressure, a knife-shaped pressure member may be utilized.

In accordance with another feature of the invention, the emitter region is doped over the point of deterioration. This enables increased emitter productivity and an additional increase in the pressure sensitivity of the device.

The pressure sensitivity of the device of the present invention increases as the distance of the collector-base p-n junction from the surface of the semiconductor body to which the pressure is applied decreases. The distance of the point of contact of the pressure point with the surface of the semiconductor body from the collector-base p-n junction is thus preferably less than 0.5 micron. This is possible in the device of the present invention since the pressure point is seated on the collector region.

In the known device the pressure point is seated on the emitter region and the penetration depth of the emitter-base p-n junction is determined by the fact that it must be greater than the free path of the charge carriers in order to produce an emission. When pressure is applied to the emitter region, the pressure sensitivity is limited by the fact that the thickness of the emitter cannot be decreased; that is, the thickness of the emitter is limited not only by production technology but by the free paths of the charge carriers.

It is preferable to protect the surface of the semiconductor device, especially at the localities where the p-n junctions emerge to the surface, by means of an oxide coating. This is preferable because it enables large areas of the individual regions, especially the collector region, to be contacted. The metal contact may cover a portion of the oxide coating since such oxide coating serves as an insulating layer. The first or emitter region and the third or collector region may thus be provided with large area electrodes, especially vapor-deposited electrodes.

The semiconductor body of the device of the present invention may comprise silicon or germanium or other suitable semiconductor material such as, for example, an $A_{III}B_V$ compound. The second and third regions should have small depths of penetration and are preferably produced by diffusion. The known diffusion method may be utilized. The planar technique has been found to be particularly expedient since in this way the oxide coating or protective layer is simultaneously produced on the semiconductor surface.

When the second and the third regions are produced by diffusion, in order to avoid a drift field which causes a slowdown of the emitted charge carriers due to the reverse design of the device rleative to the known type of transistor, it is advantageous to create at a determined temperature only as many disturbance points from the gaseous phase as correspond to the saturation solubility at the determined temperature. The diffusion then occurs in a neutral atmosphere. In this manner, the declining of the doping gradient inwardly from the surface of the crystal, which is common in diffusion, is largely prevented.

A preferred method for producing a semiconductor device of the present invention comprises epitaxially growing on a first semiconductor layer or region of one conductance type, a second region or layer of opposite conductance type; the second region being high-ohmic and very thin relative to the first semiconductor region. By subsequent annealing by diffusion of disturbance or interference points from the first semiconductor region or layer into the second layer, the p-n junction is shifted into the second layer. The third region or layer is doped by diffusion of a disturbance substance to produce an opposite conductance type from that of the second layer. In this manner, a relatively high voltage stability of the collector-base p-n junction may be obtained since according to this method the base region may be made very high-ohmic. Furthermore, the displacing of the collector-base p-n junction into the epitactic layer during the annealing process not only improves said collector-base junction, but in this manner the high-ohmic growth layer is made especially thin. This further increases the effect of the pressure variations upon the amount of emission.

The separation of the systems may occur in the usual manner by oxide-masking diffusion, with interference atoms of the same conductance type as the emitter region material. Furthermore, portions of the second and third layers or regions may be removed at least up to the first region or layer by mesa formation. The removal of these portions may be achieved by etching. The mesa-carrying surface of the semiconductor body, which is the semiconductor emitter region or layer and the mesa itself, are then preferably covered with a protective coating consisting of silicon dioxide, if germanium and silicon are utilized. A masking, which preferably comprises a photoelectric dope, is applied to the portions covered by the protective coating. The masking has an opening which exposes parts of the oxide-coated surface of the third region or layer. After the oxide coating is removed from areas not covered by the masking, a pressure member or pressure point is seated upon them. The exposed area may be of a size which permits only the areas where the collector-base p-n junction emerges to the surface of the semiconductor body to remain covered with the protective oxide coating.

In order that the present invention may be readily carried into effect, it will now be described with reference to the accompanying drawings, wherein.

Figure 1:
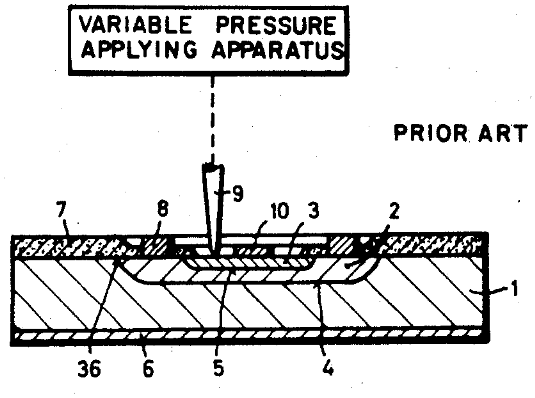
FIG. 1 is a view, partly in section, of an embodiment of a prior art device.
Figure 2:
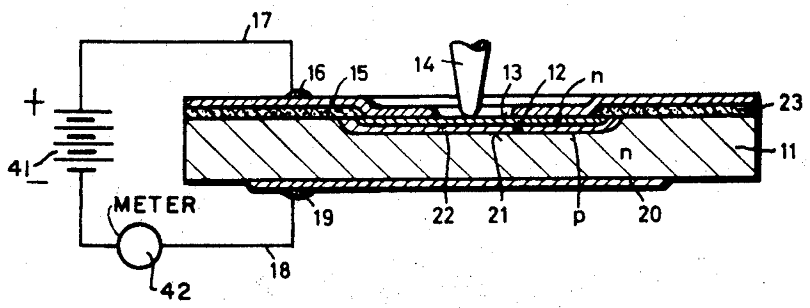
FIG. 2 is a view, partly in section, of an embodiment of the semiconductor device of the present invention produced by planar technique.

In FIG. 2, the semiconductor body may comprise silicon. An emitter region 11 comprises semiconductor material of n-conductance type. A relatively thin high-ohmic base region 12 comprises semiconductor material of p-conductance type. A collector region 13, which is thin relative to the emitter rgeion 11, comprises semiconductor material of n-conductance type. The emitter, base and collector regions are preferably produced by diffusion, especially by double diffusion.

The base region or layer 12 is formed on the emitter region or layer 11 and the base and emitter regions form the emitter-base p-n junction 21 between them. The collector region or layer 13 is formed on the base region 12 and the collector and base regions form the collector-base p-n junction 22 between them.

The masking of the surface of the semiconductor body for limited diffusion may be achieved by oxidation of said surface in the known planar technique. This provides a silicon dioxide layer 23 having an opening therethrough necessary for diffusion into the semiconductor body. The opening is preferably produced by etching.

Only the emitter region 11 and the collector region 13 are provided with electrical contacts. The emitter region 11 is provided with an electrical contact 20 and the collector region 13 is provided with an electrical contact 15. The contact 15 of the collector region 13 covers the protective coating 23.

Large-area contact of the collector region 13 may be provided for example, by vaporization. The emitter region contact 20 is produced by vaporization and by alloying a pentavalent metal such as, for example, a gold-antimony alloy, or by alloying a gold-plated plate, with the n-conductance type emitter region 11. The same procedure may be followed for the collector contact or electrode 15.

If the emitter region 11 is very low-ohmic, so that its doping concentration lies close to the degeneration concentration, or even above it, a trivalent metal such as, for example, aluminum, may be utilized as the contact 20 since the low-ohmic emitter region 11 is practically of metallic conductance.

In the embodiment of FIG. 2, the collector-base p-n junction 22 is approximately 0.5 micron below the surface of the semiconductor body and the emitter-base p-n junction 21 is approximately 1 micron below said surface. A pressure member or pressure point 14 is seated on or abuts the surface of the semiconductor body. The pressure point 14 may comprise boron carbide, although other material such as, for example, sapphire or ruby, may be utilized.

The contact or electrode 20 is provided with a terminal 19 and a terminal lead 17 and the contact or electrode 15 is provided with a terminal 16 and a terminal lead 18. When the device is in operation, the emitter electrode 20 is connected to the negative pole of a voltage source 41 and the collector electrode 15 is connected to the positive pole of said voltage source. The variation of the magnitude of the collector current resulting from the pressure applied to the semiconductor body by the pressure point 14 serves to measure the applied pressure. A meter 42 connected in the circuit of the battery 41 may be utilized to indicate the collector current.

Figure 3:
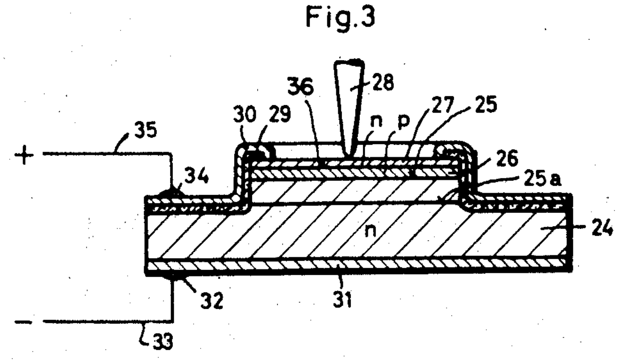
FIG. 3 is a view, partly in section, of another embodiment of the semiconductor device of the present invention produced epitaxially.

In the embodiment of FIG. 3, a low-ohmic emitter region or layer 24 may comprise, for example, n-conductance silicon. A high-ohmic p-conductance type base layer or region 26 is epitaxially grown on the region 24. The emitter region or layer 24 and the base region or layer 26 form between them the emitter-base p-n junction **25*a*. The emitter-base p-n junction 25*a* is shifted into the epitactic layer by an annealing process and becomes the emitter-base p-n junction 25**.

The n-conductance type collector region 27 is produced from above by diffusion into the high-ohmic base region 26. The base region or layer 26 and the collector region or layer 27 form between them the collector-base p-n junction 36. The conductance of the emitter region 24 is made greater than 0.5 mho. per cm. The shifting of the emitter-base p-n junction during the growth process between the emitter layer 24 and the epitactic base layer 26 amounts, for example, to a distance of 2 microns. The high-ohmic growth layer 26 thus becomes thinner even prior to the diffusion of the collector region 27.

During the development of the collector region 27 by diffusion, a further shifting of the emitter-base p-n junction into the growth layer 26 results. This is due to heat treatment. However, this shift is not very great since the depth of penetration of the collector region 27 should be as little as possible; preferably less than 0.5 micron, so that diffusion time is very short.

The thickness of the base region 26 amounts to approximately 0.5 micron in the completed semiconductor device. The system is then etched by the usual mesa technique and subsequently the p-n junctions are provided with a protective layer 29. The protective layer may comprise, for example, silicon dioxide.

A large area contact or electrode 31 is vaporized and alloyed with the emitter region 24 and a large area contact or electrode 30 is vaporized and alloyed with the collector region 27 similarly to the method utilized in producing the embodiment of FIG. 2. The contacts or electrodes 31 and 30 may comprise, for example, a gold-antimony alloy.

A masking or photoelectric dope layer is again utilized to etch an opening into the oxide layer 29 of the embodiment of FIG. 3. The masking covers all of the oxide layer except the portion to be removed. Then, by etching of the portion not covered by the masking, the collector region surface is etched free. That is, the oxide layer is removed from the portion left uncovered by the masking.

In the illustrated embodiments of the device of the present invention, the collector region surface exposed by etching is approximately at the center of the system. During vaporization involving the large-area contacts of the illustrated embodiments, the surface of the semiconductor body to which the pressure is to be applied may be pitted. The surface of the semiconductor body to which the pressure is applied should be as large as possible for high pressure sensitivity.

The pressure member or pressure point 28 abuts against the exposed surface of the collector region. The pressure point 28 may comprise either boric carbide, sapphire, ruby or hard metal. As in the embodiment of FIG. 2, the pressure point may be rounded, pointed or knife-shaped.

Figure 4:
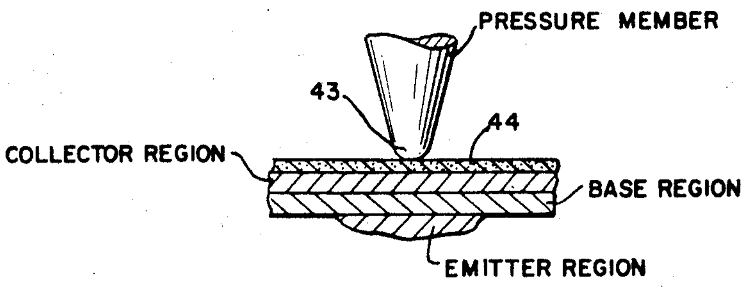
FIG. 4 is a view, partly in section, of a portion of a modification of the embodiments of FIG. 2 or 3.

FIG. 4 illustrates a modification utilizing a pressure member having a point 43 which is blunt or of large cross-sectional area and which contacts or abuts a surface powder 44. The surface powder 44 is provided on the surface of the semiconductor body where the pressure point 43 abuts. The surface powder 44 may comprise a pointed grain material in pulverized form or small balls of the same diameter. The surface powder 44 may be embedded in a plastic layer such as, for example, synthetic plastic or rubber.

Figure 5:
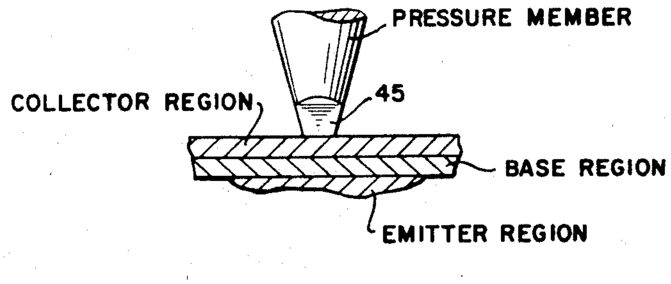
FIG. 5 is a view, partly in section, of a portion of another modification of the embodiments of FIG. 2 or 3.

FIG. 5 illustrates a modification utilizing a pressure member having a knife-shaped point 45.

Figure 6:
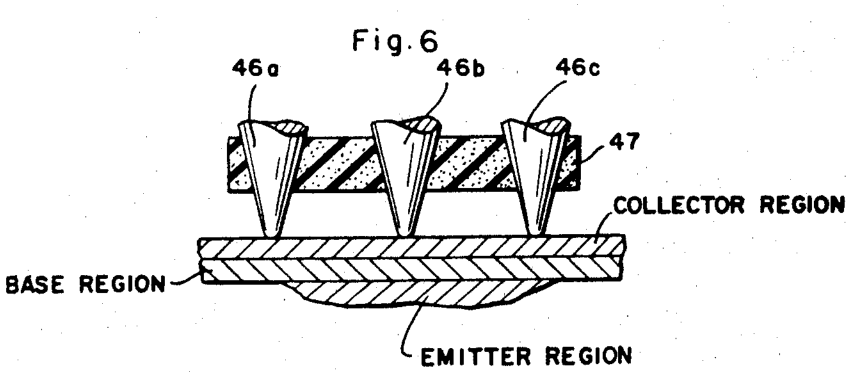
FIG. 6 is a view, partly in section, of a portion of still another modification of the embodiments of FIG. 2 or 3.

FIG. 6 illustrates a modification utilizing a plurality of pressure members or pressure points 46*a*, 46*b* and 46*c* abutting the collector region of the surface of the semiconductor body. The plurality of pressure points 46*a*, 46*b* and 46*c* may be supported or embedded in an elastic medium 47 such as, for example, silicon rubber. The pressure points protrude from the embedding medium.

While the invention has been described by means of specific examples and in a specific embodiment, I do not wish to be limited thereto, for obvious modifications will occur to those skilled in the art without departing from the spirit and scope of the invention.

I claim:

1. A method of producing a semiconductor device, comprising the steps of providing a low-ohmic first semiconductor layer of determined conductance type and of determined thickness;

epitaxially growing on said first layer a high-ohmic second semiconductor layer of the opposite conductance type from said determined conductance type and of substantially less thickness than said determined thickness to form a p-n junction between said first and second semiconductor layers;

annealing said semiconductor layers to cause diffusion of disturbance points from said first semiconductor layer to said second semiconductor layer to shift said p-n junction into said second semiconductor layer;

doping said second semiconductor layer by diffusion of a disturbance substance to provide a third semiconductor layer of said determined conductance type and of substantially less thickness than said determined thickness;

etching away portions of said second and third semiconductor layers to provide a mesa;

covering the mesa and the first semiconductor layer with a protective coating;

applying a masking layer to said protective coating except for a determined portion thereof covering said third semiconductor layer;

removing the determined portion of said protective coating to expose the surface of the third semiconductor layer beneath said determined portion; and placing a pressure point in contact with the exposed surface of said third semiconductor layer.

2. A method of producing a semiconductor device, comprising the steps of providing a low-ohmic first semiconductor layer of determined conductance type and of determined thickness;

epitaxially growing on said first layer a high-ohmic second semiconductor layer of the opposite conductance type from said determined conductance type and of substantially less thickness than said determined thickness to form a p-n junction between said first and second semiconductor layers;

annealing said semiconductor layers to cause diffusion of disturbance points from said first semiconductor layer to said second semiconductor layer to shift said p-n junction into said second semiconductor layer;

doping said second semiconductor layer by diffusion of a disturbance substance to provide a third semiconductor layer of said determined conductance type and of substantially less thickness than said determined thickness;

etching away portions of said second and third semiconductor layers to provide a mesa;

covering the mesa and the first semiconductor layer with a protective coating of silicon dioxide;

applying a masking layer of photo-varnish to said protective coating except for a determined portion thereof covering said third semiconductor layer;

removing the determined portion of said protective coating to expose the surface of the third semiconductor layer beneath said determined portion; and placing a pressure point in contact with the exposed surface of said third semiconductor layer.

References Cited

UNITED STATES PATENTS 3,233,305 2/1966 Dill ---------------- 148—188

WILLIAM I. BROOKS, *Primary Examiner.*

U.S. Cl. X.R.

29—576, 580; 148—75; 310—8.7